US006812744B2

(12) United States Patent
Lee et al.

(10) Patent No.: US 6,812,744 B2
(45) Date of Patent: Nov. 2, 2004

(54) INTEGRATED CIRCUIT BETA COMPENSATOR FOR EXTERNAL INTERFACE CIRCUITRY

(75) Inventors: Kim Fung Lee, Austin, TX (US); Saroj Rout, Austin, TX (US); Marius Goldenberg, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 230 days.

(21) Appl. No.: 10/262,579

(22) Filed: Sep. 28, 2002

(65) Prior Publication Data

US 2004/0061137 A1 Apr. 1, 2004

(51) Int. Cl.[7] .................... H03K 19/0175; G05F 3/16
(52) U.S. Cl. ..................... 326/89; 323/313; 327/538
(58) Field of Search .................. 326/31, 33, 89; 323/315, 316; 327/538

(56) References Cited

U.S. PATENT DOCUMENTS 3,781,648 A  * 12/1973  Owens ..................... 323/313
6,194,886 B1 *  2/2001  D'Aquino et al. .......... 323/315
6,407,620 B1 *  6/2002  Hirayama ................. 327/538

FOREIGN PATENT DOCUMENTS

EP            0582072 A1 *  2/1994

* cited by examiner

*Primary Examiner*—Daniel D. Chang
(74) *Attorney, Agent, or Firm*—Davis & Associates; William D. Davis (57) ABSTRACT

An apparatus for interfacing an integrated circuit with external circuitry includes a transistor having an emitter coupled to a node for receiving a control current (IP) from the integrated circuit. A beta compensator disposed within the integrated circuit provides a compensating current (IM) to the node. The compensating current IM is proportional to a base current (IB) of the transistor. A method of interfacing the integrated circuit with external circuitry includes the step of providing the control current (IP) from the integrated circuit to a node coupled to a transistor emitter. A compensating current (IM) is provided to the node in response to the transistor base current (IB). The net node current provided to the emitter is IP+IB so that the transistor collector current is substantially the same as the control current. The transistor collector is coupled to the external circuitry.

21 Claims, 6 Drawing Sheets

INTEGRATED CIRCUIT BETA COMPENSATOR FOR EXTERNAL INTERFACE CIRCUITRY

FIELD OF THE INVENTION

This invention relates to the field of interface circuitry. In particular, this invention is drawn to beta compensation of interface circuitry between an integrated circuit and circuitry external to the integrated circuit.

BACKGROUND OF THE INVENTION

Complementary metal oxide semiconductor (CMOS) fabricated integrated circuits are popular due to well known manufacturing requirements, availability of design tools, and cost of production. Although CMOS integrated circuits may be fabricated for either high or low voltage operation, data manipulation functions such as signal processing, computational, storage, and other data handling functions are typically implemented with low voltage processes due to cost considerations. CMOS integrated circuit fabricated with low voltage processes are not well suited for direct interfacing with higher voltage circuits.

Interface circuitry can be used to interface the CMOS circuitry with higher voltage circuitry. Signals communicated through the interface circuitry are subject to modification or distortion in accordance with the transfer characteristic of the interface circuitry. Bipolar junction transistors (BJT) are frequently used to interface CMOS circuitry with higher voltage circuitry. The current transfer characteristic between the collector and emitter of a BJT is referred to as $\alpha$ (alpha) which is itself a function of the transistor common emitter current gain, $\beta$ (beta).

One disadvantage of BJT interface circuitry is that $\beta$ may vary widely between transistors of similar make and manufacture. As a result, the transfer functions of interface circuitry may vary considerably. Although compensation circuitry may be introduced to minimize variations between individual interface circuitry, such compensation circuitry typically requires additional external components that tend to increase the cost of manufacturing and assembling a system with the integrated circuit and the interface circuitry.

SUMMARY OF THE INVENTION

An apparatus for interfacing an integrated circuit with external circuitry includes a transistor having an emitter coupled to a node for receiving a control current (IP) from the integrated circuit. A beta compensator disposed within the integrated circuit provides a compensating current (IM) to the node. The compensating current IM is proportional to a base current (IB) of the transistor.

In one embodiment, the transistor is a bipolar junction transistor. The transistor collector is coupled to the external circuitry. When the proportionality factor between IM and IB is unity, the transistor collector current (IC) is substantially the same as the control current (IC=IP).

A method of interfacing the integrated circuit with external circuitry includes the step of providing a control current (IP) from the integrated circuit to a node. A transistor emitter is coupled to the node. A compensating current (IM) is provided to the node in response to the transistor base current (IB). The net node current provided to the emitter is IP+IB.

In one embodiment, the method and apparatus are applied to a linefeed driver of a subscriber line interface circuit.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
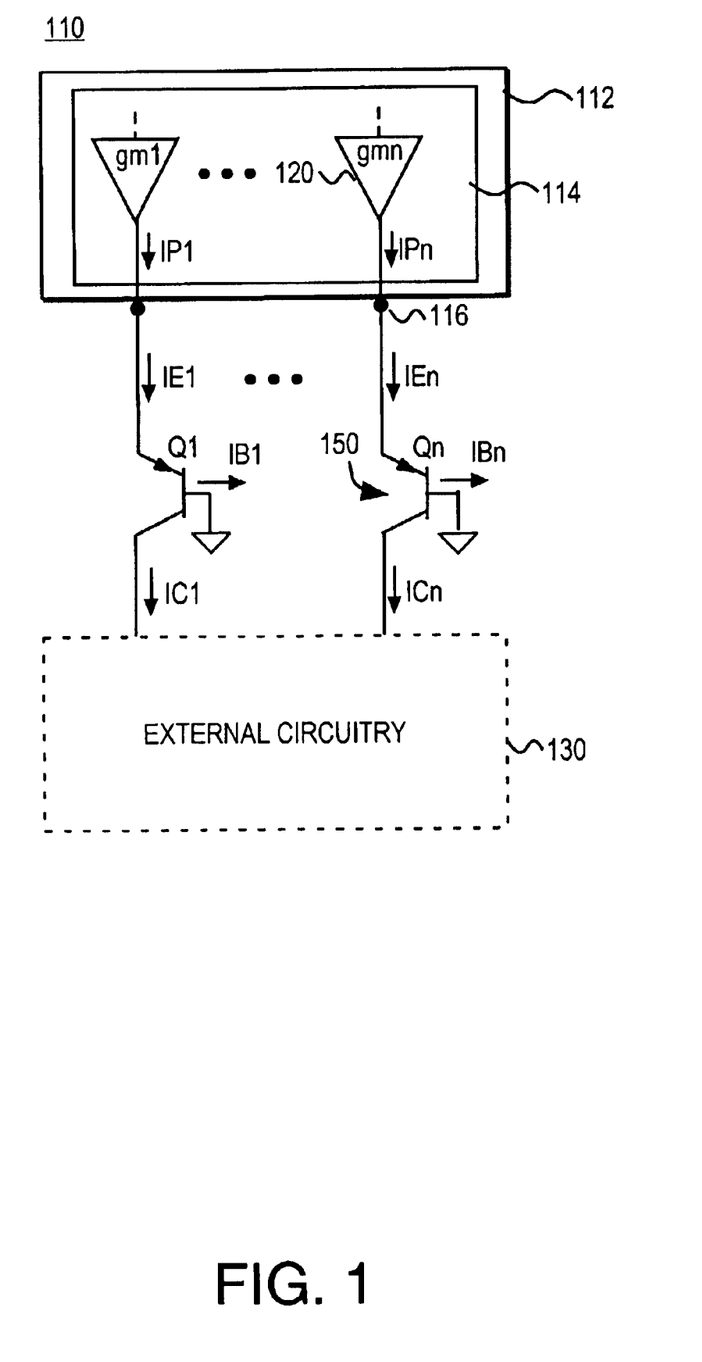
FIG. 1 illustrates interface circuitry for coupling an integrated circuit to otherwise incompatible external circuit.

FIG. 1 illustrates one embodiment of interface circuitry 150 for coupling an integrated circuit 110 to external circuitry 130. The interface circuitry may be used, for example, to communicate signals between the integrated circuit operating at one voltage and external circuitry operating at a much higher voltage.

Integrated circuit 110 includes an integrated circuit die 114 disposed within an integrated circuit package 112. In one embodiment, integrated circuit 110 includes pins 116 for electrically coupling circuitry within the integrated circuit to external circuitry. "External" in this context refers to circuitry external to the integrated circuit package 112.

Operational voltage and current limits for the integrated circuit depend upon the circuit design as well as the fabrication process. In one embodiment, integrated circuit 110 is a complementary metal oxide semiconductor (CMOS) integrated circuit. Interface circuitry such as bipolar junction transistors (BJT) can be used to interface the integrated circuit with external circuitry having otherwise incompatible operational limits.

In the illustrated embodiment, control currents are provided from a transconductance amplifier 120 within the integrated circuit. The control currents may be generated by other circuitry within the integrated circuit. The interface circuitry should provide a predictable transfer function for control currents such as IP1.

Given that the transconductance amplifier is coupled to the emitter of each interface transistor (e.g., Q1), the control current is also the emitter current (IP=IE). The collector of the interface transistor is coupled to the external circuitry 130. The external circuitry receives a collector current of IC=IE−IB. The base current is related to the collector current such that IC=$\beta$IB. The collector-to-emitter transfer function $$\frac{IC}{IE} = \frac{\beta}{\beta+1} = \alpha.$$

As β increases, α approaches 1. Conversely, as α→1, β→∞. The current thus provided to the external circuitry is $$\frac{\beta}{\beta+1} IP$$

where the transistor beta is a manufacturing variable.

Small variations around a relatively high β may produce negligible differences between the transfer functions of different instantiations of the interface circuitry. A realistic β range of 40–250, however, can result in a variation of approximately 3% in the collector current. This may be unacceptable in a number of applications.

A Darlington transistor pair can be used to increase the effective β for the transfer function. A Darlington pair, however, results in two base-to-emitter junction voltage drops between the integrated circuit pin 116 and signal ground. The additional junction leaves less operational range or "headroom" to work within. For some applications, the additional voltage drop and loss of headroom may be unacceptable. In addition the assembly costs of an additional external transistor or alternatively the manufacturing costs of a Darlington pair are undesirable.

Figure 2:
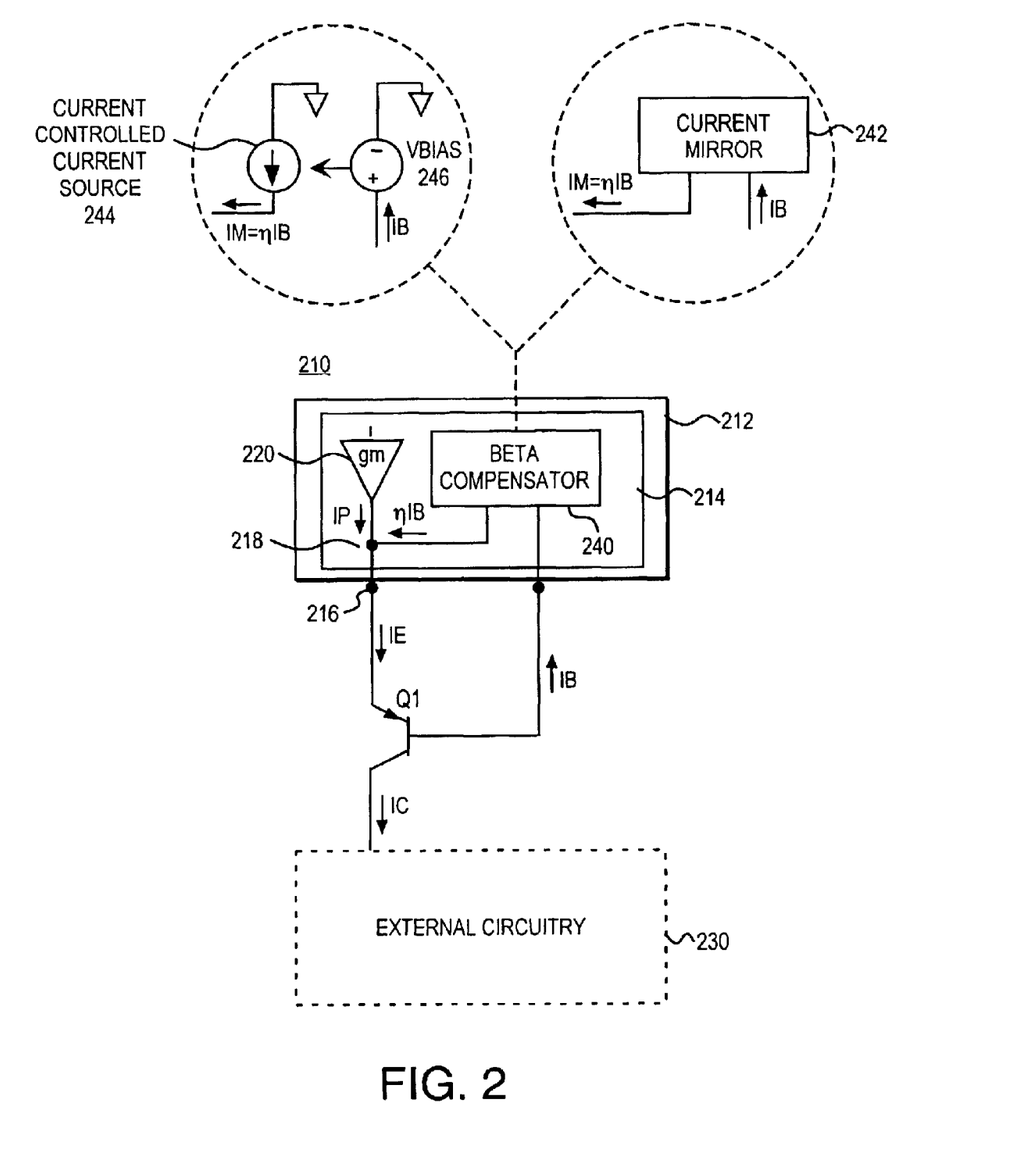
FIG. 2 illustrates one embodiment of an improved interface circuit.

FIG. 2 illustrates an alternative solution. Integrated circuit 210 comprises an integrated circuit die 214 disposed within an integrated circuit package 212. Integrated circuit 210 provides a control current to otherwise incompatible external circuitry 230 through interface transistor Q1.

Integrated circuit 210 includes beta compensation circuitry such as beta compensator 240 located on the integrated circuit die 214. In one embodiment beta compensator 240 includes a current mirror 242. In an alternative embodiment, beta compensator 240 includes a current controlled current source 244.

Transconductance amplifier 220 provides the control current, IP, to node 218 within the integrated circuit. The emitter of transistor Q1 is coupled to node 218 through the connection to integrated circuit pin 216. Beta compensator 240 provides a compensation current (IM) to node 218. The compensation current is proportional to the transistor base current (i.e., IM=ηIB). In one embodiment, the proportionality factor is selected to be unity (η=1) so that the net node current received by the emitter is the sum of the control and base currents (IE=IP+IB).

Applying the transfer function, $$IC = \frac{\beta}{\beta+1}(IP + IB).$$

Simplifying with the substitution $$IB = \frac{1}{\beta} IC$$

yields:

$$IC = \frac{\beta}{\beta+1} IP + \frac{\beta}{\beta+1} \cdot \frac{IC}{\beta}$$

Subtracting $$\frac{IC}{\beta+1}$$

from both sides yields:

$$\frac{\beta+1}{\beta+1} IC - \frac{1}{\beta+1} IC = \frac{\beta}{\beta+1} IP; \text{ which reduces to } IC = IP$$

The configuration of FIG. 1 would require an infinite effective beta ($\beta_{\mathit{eff}} \to \infty$) to achieve the same result. In this case, the compensation current IM provided by the beta compensator increases the emitter current sufficiently to render the IC/IP transfer function independent of the transistor's β. Moreover, the headroom loss is limited to the contribution of a single base-to-emitter junction voltage drop plus any bias voltage (246) across the beta compensator instead of the alternative of at least two base-to-emitter junction voltage drops contributed by a Darlington solution.

Figure 3:
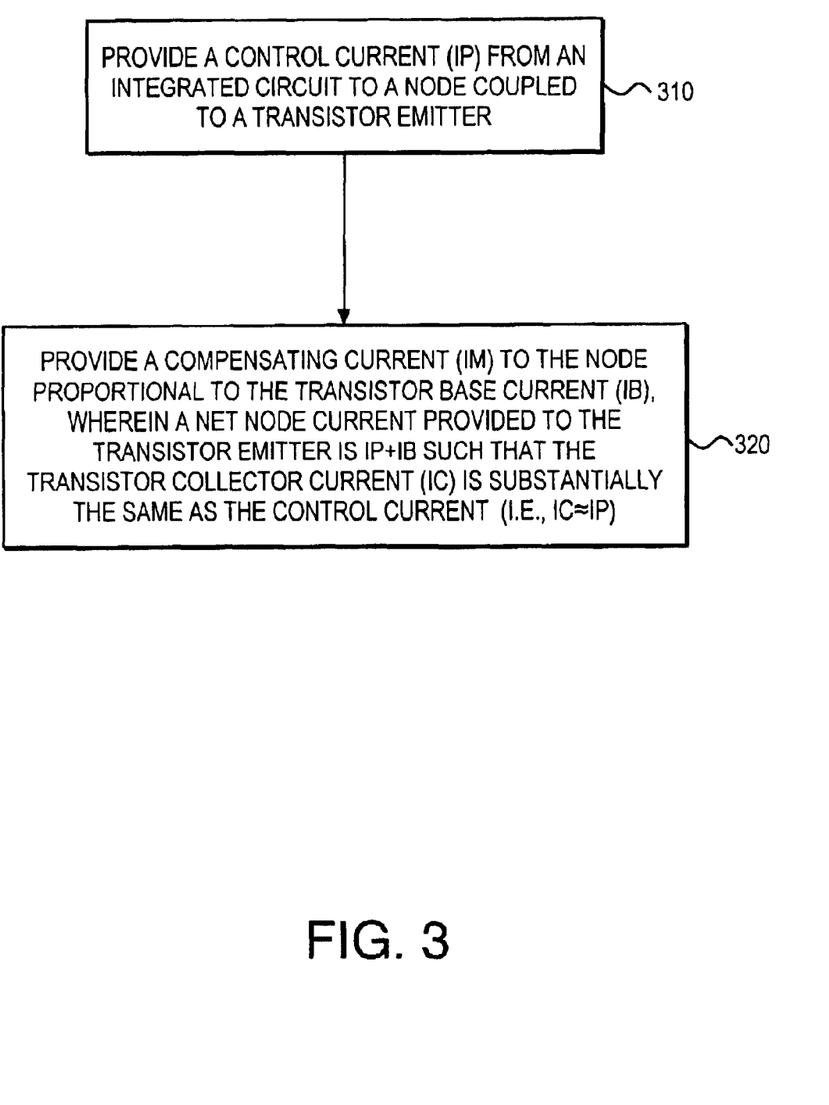
FIG. 3 illustrates a method of interfacing the integrated circuit with an external circuit.

FIG. 3 illustrates one embodiment of a method for interfacing an integrated circuit with external circuitry. A control current IP is provided by the integrated circuit to a node in step 310. The transistor emitter is coupled to the node. In step 320, a compensation current equal to the transistor base current (IM=IB) is generated within the integrated circuit and provided to the same node. The net node current provided to the emitter is now IP+IB. Since, IC=IE−IB, the result is that IC=IP independent of transistor beta.

Figure 4:
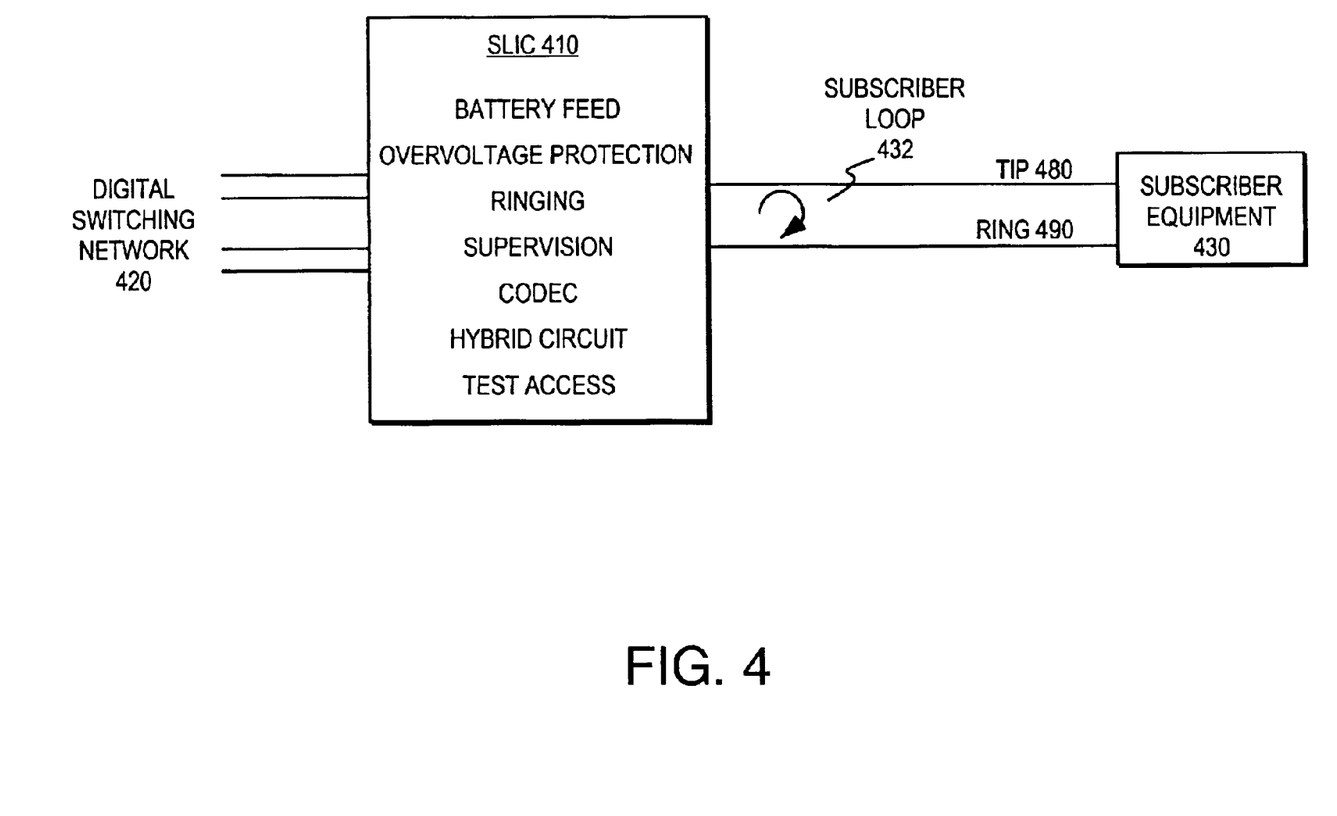
FIG. 4 illustrates one embodiment of a subscriber loop.

One application for such an interface circuit is a subscriber line interface circuit (SLIC). FIG. 4 illustrates functional elements of one embodiment of a SLIC 410 typically associated with plain old telephone services (POTS) telephone lines. The SLIC provides an interface between the digital switching network 420 of a local telephone company central exchange and a subscriber loop 432 formed by tip 480 and ring 490 lines and subscriber equipment 430.

The subscriber loop 432 is used for communicating analog data signals (e.g., voiceband communications) as well as subscriber loop "handshaking" or control signals. The SLIC is expected to perform a number of functions often collectively referred to as the BORSCHT requirements. BORSCHT is an acronym for "battery feed," "overvoltage protection," "ring," "supervision," "codec," "hybrid," and "test."

The SLIC provides power to the subscriber equipment 430 using the battery feed function. The codec function has relatively low power requirements and can be implemented in a low voltage integrated circuit operating in the range of approximately 5 volts or less, thus suitable for complementary metal oxide semiconductor type components. The battery feed and supervision circuitry typically operate in the range of −40 to −75 volts with respect to ground potential. In some implementations the ringing function is handled by the same circuitry as the battery feed and supervision circuitry. In other implementations, the ringing function is performed by higher voltage ringing circuitry (75–150 $V_{rms}$). Thus depending upon implementation, the ringing function and other functions may be implemented with circuitry having greater voltage or current operating requirements than the circuitry associated with implementation of the remaining functions.

In one embodiment, pulse code modulation is used to encode the voiceband data. The SLIC also typically provides a means to test for or to indicate faults that may exist in the subscriber loop or the SLIC itself.

Figure 5:
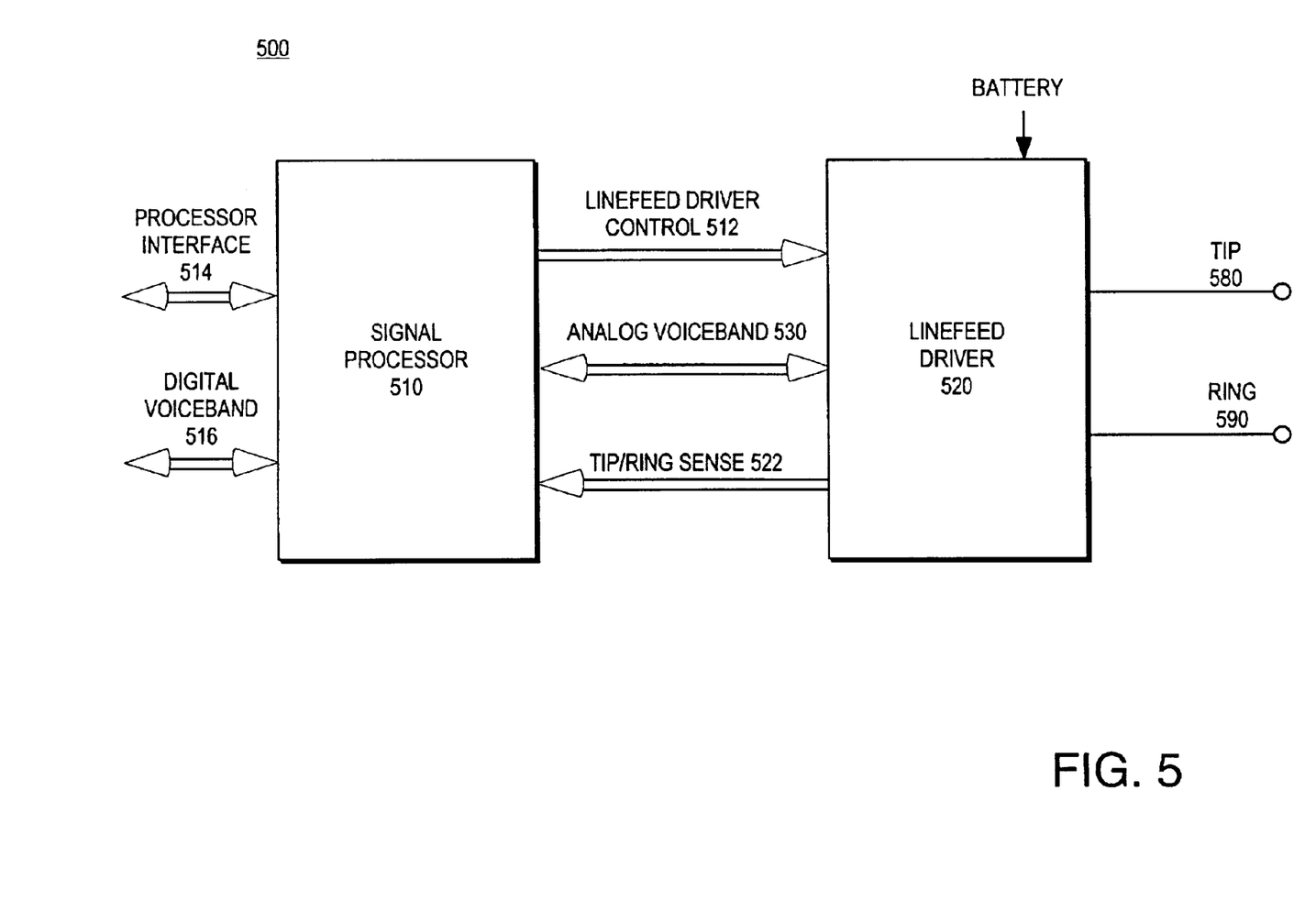
FIG. 5 illustrates one embodiment of a subscriber line interface circuit.

FIG. 5 illustrates one embodiment of a SLIC 500 where the BORSCHT functions have been distributed between a signal processor 510 and a linefeed driver 520. Signal processor 510 is responsible for at least the ring control, supervision, codec, and hybrid functions. Signal processor 510 controls and interprets the large signal subscriber loop control signals as well as handling the small signal analog voiceband signal and the digital voiceband data.

Signal processor 510 receives subscriber loop current and voltage operating information from linefeed driver 520 as indicated by tip/ring sense 522. This information is used to generate control signals for linefeed driver 520 as indicated by linefeed driver control 512. The voiceband 530 signal is used for bi-directional communication of the analog voiceband signal between linefeed driver 520 and signal processor 510.

Signal processor 510 includes a digital interface for communicating digitized voiceband data to the digital switching network using digital voiceband 516. In one embodiment, the digital interface includes a processor interface 514 to enable programmatic control of the signal processor 510. The processor interface effectively enables programmatic or dynamic control of battery control, battery feed state control, voiceband signal amplification and level shifting, longitudinal balance, ringing currents, and other subscriber loop control parameters as well as setting thresholds such as a ring trip detection thresholds and an off-hook detection threshold.

The digital voiceband data 516 is coupled to a digital codec interface of signal processor 510 for bi-directional communication of the digital voiceband data between the codec of the signal processor and the digital switching network. The analog voiceband signal 530 is coupled to an analog codec interface of signal processor 510 for bi-directional communication of the analog voiceband signal between the codec and the linefeed driver.

Linefeed driver 520 maintains responsibility for battery feed to tip 580 and ring 590. Linefeed driver 520 includes sense circuitry to provide signal processor 510 with predetermined sensed subscriber loop operating parameters as indicated by tip/ring sense 522. Signal processor 510 performs any necessary processing on the sensed parameters in order to determine the operational state of the subscriber loop. For example, differences or sums of sensed voltages and currents are performed as necessary by signal processor 510 rather than linefeed driver 520. Thus common mode and differential mode components (e.g., voltage and current) of the subscriber loop are calculated by the signal processor rather than the linefeed driver.

Linefeed driver 520 modifies the large signal tip and ring operating conditions in response to linefeed driver control 512 provided by signal processor 510. This arrangement enables the signal processor to perform processing as needed to handle the majority of the BORSCHT functions. For example, the supervisory functions of ring trip, ground key, and off-hook detection can be determined by signal processor 510 based on operating parameters provided by tip/ring sense 522.

Figure 6:
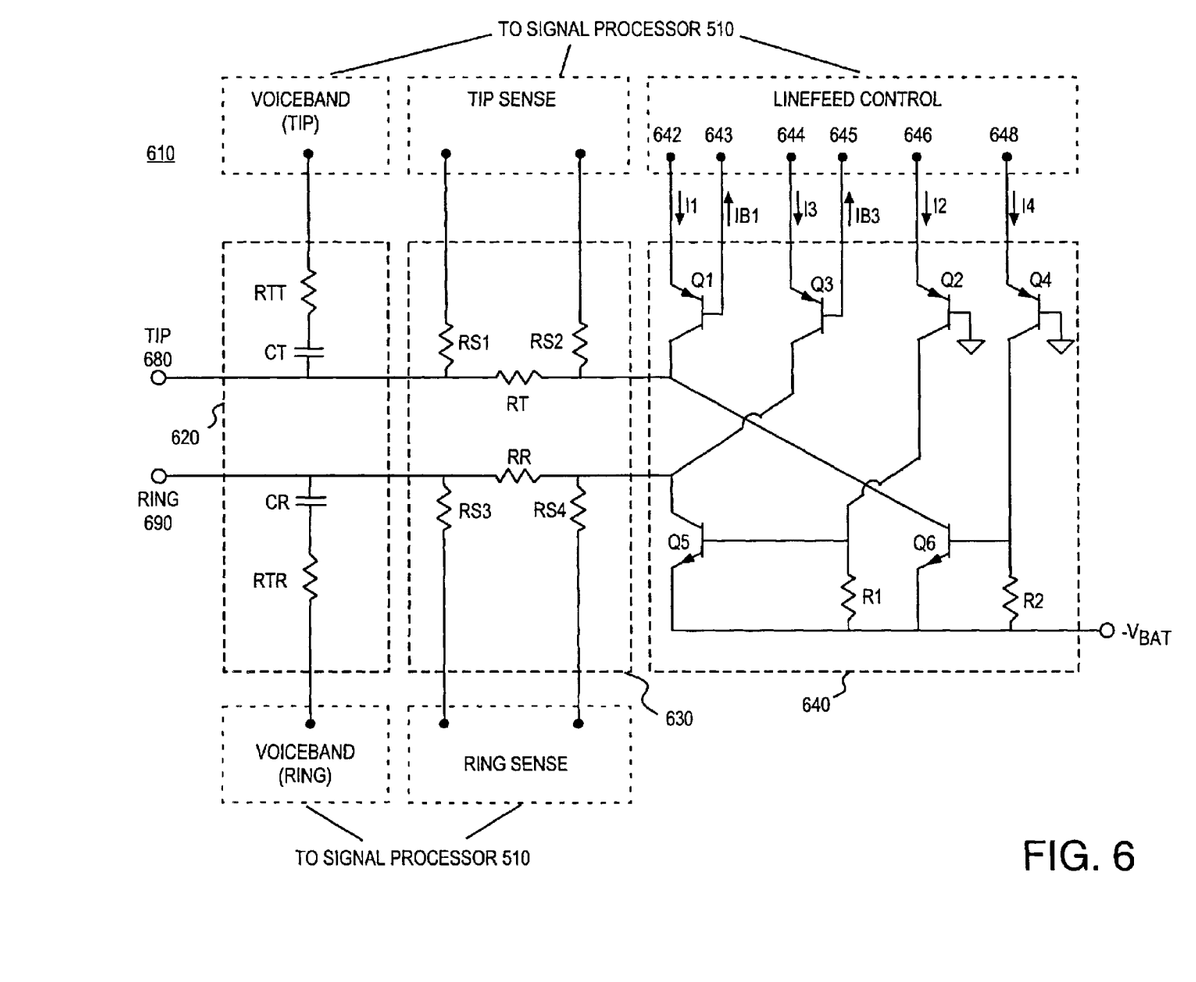
FIG. 6 illustrates one embodiment of a linefeed driver circuit with the improved interface circuit.

FIG. 6 illustrates one embodiment of a SLIC linefeed driver 610. In one embodiment, the linefeed driver 610 is implemented as a number of discrete components. Linefeed driver 610 includes voiceband circuitry 620, sensing circuitry 630, and power circuitry 640.

Voiceband circuitry 620 enables analog signals corresponding to voiceband communications to be retrieved from the subscriber loop for upstream communications from the subscriber equipment. In one embodiment, downstream voiceband communications to the subscriber equipment are impressed onto the subscriber loop by superimposing the audio signals onto the control currents (I1 and I3) for Q1 and Q3 of the power circuitry 640 discussed below.

Sensing circuitry 630 enables signal processor 510 to determine the tip 680 and ring 690 node voltages as well as the subscriber loop current. Power circuitry 640 provides the battery feed and other relatively high voltage functions to the subscriber loop in accordance with analog linefeed control signals provided by the signal processor 510 at nodes 642, 643, 644, 645, 646, and 648.

The subscriber loop current and the tip and ring voltages are controlled by transistors Q1–Q6. In one embodiment, Q1–Q4 are PNP bipolar junction transistors and Q5–Q6 are NPN bipolar junction transistors. Transistors Q1, Q4, and Q6 (and resistor R2) control the tip voltage 680. The tip voltage is increased by the application of control current I1 to Q1. The tip voltage (node 680) is decreased by the application of control current I4 to Q4. Thus control currents I1 and I4 effectively provide a tip control signal for manipulating the tip voltage at node 680.

Similarly, transistors Q2, Q3, and Q5 (and resistor R1) control the ring voltage 690. The application of control current I3 to Q3 increases the ring voltage. The ring voltage is decreased by the application of control current I2 to Q2. Control currents I2 and I3 effectively provide a ring control signal for manipulating the ring voltage at node 690.

In one embodiment, I2 and I4 are maintained at a substantially constant value so that subscriber loop control is handled by control currents I1 and I3. Compensation is provided to enhance the effective beta of transistors Q1 and Q3. Decreasing any mismatch of betas between transistors Q1 and Q3 has the added benefit of improving longitudinal balance.

The base terminals of transistors Q1 and Q3 are provided to the signal processor at nodes 643 and 645, respectively. Signal processor 510 includes beta compensation circuitry. In one embodiment, the beta compensation circuitry comprises current mirrors mirroring base currents IB1 and IB3 to provide corresponding compensating currents. In an alternative embodiment, the beta compensation circuitry comprises current controlled current sources for providing compensating currents in accordance with base currents IB1 and IB3.

The compensating currents are provided to nodes receiving the control currents, I1 and I3, respectively. The emitters of transistors Q1 and Q3 thus receive currents corresponding to I1+IB1 and I3+IB3. The resulting collector currents are I1 and I3, respectively. The collector currents thus reflect the control currents substantially independently of the transistor betas. In an alternative embodiment, beta compensation is similarly provided for transistors Q2 and Q4.

Methods and apparatus for interfacing integrated circuits with otherwise incompatible external circuitry have been provided. Beta compensation circuitry such as a current mirror or current controlled current source within the integrated circuit is coupled to provide a compensating current to a node also receiving a control current from the integrated circuit. The compensating current matches the base current of an interface transistor. The transistor's emitter is coupled to the node so that the emitter current is the sum of the control and compensating (i.e., base) currents. The transistor's collector is coupled to the external circuitry. The collector current is substantially the same as the control current.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus for interfacing an integrated circuit with external circuitry, comprising:
   a transistor having an emitter coupled to a node for receiving a control current (IP) from the integrated circuit; and
   a beta compensator disposed within the integrated circuit, the beta compensator providing a compensating current (IM) to the node, wherein IM is proportional to a base current (IB) of the transistor.

2. The apparatus of claim 1 wherein a ratio of proportionality is substantially unity (IM=IB), wherein a net node current to the emitter is IP+IB such that a collector current (IC) of the transistor is substantially the same as the control current (IC=IP).

3. The apparatus of claim 1 wherein the transistor does not reside in a same integrated circuit package as the integrated circuit.

4. The apparatus of claim 1 wherein the transistor resides within a same integrated circuit package as the integrated circuit.

5. The apparatus of claim 1 wherein the node and the integrated circuit are disposed within a same integrated circuit package.

6. The apparatus of claim 1 wherein the node and the integrated circuit are not disposed within a same integrated circuit package.

7. The apparatus of claim 1 wherein the integrated circuit is a complementary metal oxide semiconductor fabricated integrated circuit.

8. The apparatus of claim 1 wherein the transistor is a bipolar junction transistor.

9. The apparatus of claim 1 wherein the integrated circuit and transistor form a portion of a subscriber line interface circuit.

10. The apparatus of claim 1 wherein a collector of the transistor is coupled to the external circuitry.

11. The apparatus of claim 1 wherein the beta compensator further comprises:
    a current mirror generating the compensating current as a mirrored base current of the transistor.

12. The apparatus of claim 1 wherein the beta compensator further comprises:
    a current controlled current source generating the compensating current in accordance with the base current of the transistor.

13. A method comprising the steps of:
    a) providing an control current (IP) from an integrated circuit to a node;
    b) coupling an emitter of a transistor to the node; and
    c) providing a compensating current (IM) to the node in response to a base current (IB) of the transistor, wherein a net node current provided to the emitter is IP+IM, wherein IM=IB.

14. The method of claim 13 wherein the node and the integrated circuit are disposed within a same integrated circuit package.

15. The method of claim 13 wherein the node and the integrated circuit are not disposed within a same integrated circuit package.

16. The method of claim 13 wherein the transistor is not disposed within a same integrated circuit package as the integrated circuit.

17. The method of claim 13 wherein the transistor is disposed within a same integrated circuit package as the integrated circuit.

18. The method of claim 13 wherein the integrated circuit is a complementary metal oxide semiconductor (CMOS) integrated circuit.

19. The method of claim 13 wherein the transistor is a bipolar junction transistor.

20. An apparatus for interfacing an integrated circuit with external circuitry, comprising:
    an integrated circuit incorporating a beta compensation circuit, the integrated circuit providing a control current (IP) to a node;
    a transistor having an emitter coupled to the node, wherein the beta compensation circuit is coupled to provide a compensating current (IM) to the node, wherein the compensating current is substantially equal to a base current (IB) of the transistor such that the transistor emitter current is IP+IB.

21. The apparatus of claim 20 wherein the integrated circuit is a complementary metal oxide semiconductor integrated circuit, wherein the transistor is a bipolar junction transistor.

* * * * *